United States Patent [19]

Ashkinazi et al.

[11] Patent Number: 5,733,815
[45] Date of Patent: Mar. 31, 1998

[54] PROCESS FOR FABRICATING INTRINSIC LAYER AND APPLICATIONS

[75] Inventors: German Ashkinazi, Tel Aviv; Mark Leibovich, Rishon Lezion; Boris Meyler, Ramat Gan; Menachem Nathan, Tel Aviv; Leonid Zolotarevski, Tel Aviv; Olga Zolotarevski, Tel Aviv, all of Israel

[73] Assignee: Ramot University Authority for Applied Research & Industrial Development Ltd., Tel Aviv, Israel

[21] Appl. No.: 341,545
[22] PCT Filed: May 20, 1993
[86] PCT No.: PCT/US93/04782
§ 371 Date: Nov. 18, 1994
§ 102(e) Date: Nov. 18, 1994
[87] PCT Pub. No.: WO93/24954
PCT Pub. Date: Dec. 9, 1993

[30] Foreign Application Priority Data

May 22, 1992 [IL] Israel ......................................... 101966

[51] Int. Cl.⁶ ..................................................... H01L 21/20
[52] U.S. Cl. ..................... 438/546; 438/495; 438/505; 438/522; 438/565
[58] Field of Search ........................ 457/119, 120, 457/121, 124, 125, 495, 525, 522, 546, 565

[56] References Cited

U.S. PATENT DOCUMENTS

| 3,859,148 | 1/1975 | Dawson et al. |
| 3,997,377 | 12/1976 | Izawa et al. |
| 4,238,252 | 12/1980 | Kamath et al. ........................ 148/171 |
| 5,185,272 | 2/1993 | Makiuchi et al. |

OTHER PUBLICATIONS

Holmes et al, "Growth of InP by Infinite Solution LPE" Journal of Crystal Growth vol. 54 (1981) pp. 51–58.

*Primary Examiner*—Robert Kunemund
*Attorney, Agent, or Firm*—Mark M. Friedman

[57] ABSTRACT

A method of simultaneously forming a gallium arsenide p-i-n structure having p, i, and n regions, which includes heating to dissolve gallium arsenide in a solvent such as bismuth or gallium to form a saturated solution of gallium arsenide in the solvent, contacting the solution with a gaseous mixture, which mixture includes hydrogen, water vapor and products of reactions between the hydrogen and the water vapor with the solvent and with silicon dioxide, to form a contacted solution, coating a suitably selected substrate, such as a group III-V compound such as gallium arsenide, with the contacted solution, cooling the coated substrate to precipitate gallium arsenide from the contacted solution onto the substrate, and removing the substrate coated with a layer of gallium arsenide having a p-i-n structure which constitutes the product having an i region dopant concentration of less than about $10^{12}$ cm$^{-3}$.

22 Claims, 3 Drawing Sheets

PROCESS FOR FABRICATING INTRINSIC LAYER AND APPLICATIONS

FIELD AND BACKGROUND OF THE INVENTION

The present invention relates to methods of fabricating gallium arsenide (GaAs) positive-intrinsic-negative (p-i-n) structures, the resulting devices and their applications and, more particularly, the present invention relates to methods of using Liquid Phase Epitaxy (LPE) to create gallium arsenide structures which include a positive-intrinsic-negative structure, to the resulting p-i-n devices themselves, and to various applications which make us of these devices.

Intense research has been ongoing in an effort to commercialize GaAs as a semiconducting material in various applications. GaAs offers a number of theoretical advantages over silicon, which is currently of widespread use as a semiconductor.

One of the advantages of GaAs is that, unlike silicon, GaAs possesses several vacancy types, which, together with amphoteric dopants such as Si, make it possible to create regions where donors and acceptors balance each other to form a zone of low dopant concentration—the intrinsic zone. This makes it theoretically possible to form GaAs positive-intrinsic-negative (p-i-n) structures having properties making them superior to silicon p-n structures for a variety of applications. While p-i-n structures are known, the i-layer in such structures typically possesses compensated doping concentration of greater than $10^{14}$ cm$^{-3}$.

While such structures are useful, the relatively high dopant levels heretofore available tend to somewhat limit the usefulness of the structures. Thus, p-i-n structures having an i-layer which is nearly intrinsic, i.e., which features a compensated doping concentration of less than $10^{12}$ cm$^{-3}$, while highly desirable, have heretofore been impossible to fabricate. In what follows, whenever the i-layer, or a p-i-n structure, is specified in the context of the present invention, it is intended to indicate an i-layer or p-i-n structure having a compensated doping concentration of less than $10^{12}$ cm$^{-3}$.

There is thus a widely recognized need for, and it would be highly advantageous to have, methods for fabricating GaAs p-i-n structures, in the sense of the present invention, the resulting structures themselves, and useful devices into which such structures could be incorporated.

SUMMARY OF THE INVENTION

According to the present invention there is provided a method of simultaneously forming a gallium arsenide p-i-n structure having p, i and n regions, comprising: (a) heating to dissolve gallium arsenide in a solvent to form a saturated solution of gallium arsenide in the solvent; (b) contacting the solution with a gaseous mixture, which mixture includes hydrogen, water vapor and products of reactions between the hydrogen and the water vapor with the solvent and with silicon dioxide, to form a contacted solution; (c) coating a suitably selected substrate with the contacted solution; (d) cooling the coated substrate to precipitate gallium arsenide from the contacted solution onto the substrate; (e) removing the substrate coated with a layer of gallium arsenide having a p-i-n structure which constitutes the product, the p-i-n structure having an i region with a dopant concentration of less than about $10^{12}$ cm$^{-3}$.

Further according to the present invention there is provided a gallium arsenide p-i-n structure as created by the method described above.

Further still according to the present invention there are provided diodes, thermosensors, neutron detectors, gamma detectors, opto-modulators, asymmetrical thyristors, and opto-thyristors, each including a gallium arsenide p-i-n structure created by the method described above.

What is disclosed and claimed herein are processes for fabricating GaAs p-i-n structures, the structures themselves, and a series of applications incorporating the structures. Specifically, LPE is used to create a GaAs structure which features three regions, one rich in donors, one rich in acceptors, and a third region, located intermediate between the two others, which is virtually free of donors or acceptors, i.e., an intrinsic region.

The structure is fabricated by coating a substrate with a melt solution of GaAs which had been exposed to hydrogen gas containing water vapor in the presence of silicon dioxide and then cooling the system at a controlled rate so as to induce the precipitation of the GaAs onto the substrate.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of methods of creating p-i-n structures of desired dimensions using GaAs and of the resulting devices and various applications into which the devices are incorporated. Specifically, the present invention can be used to create GaAs p-i-n structures which have performance parameters which are superior to those of previously known structures or devices.

The principles and operation of methods according to the present invention may be better understood with reference to the drawings and the accompanying description.

Figure 1:
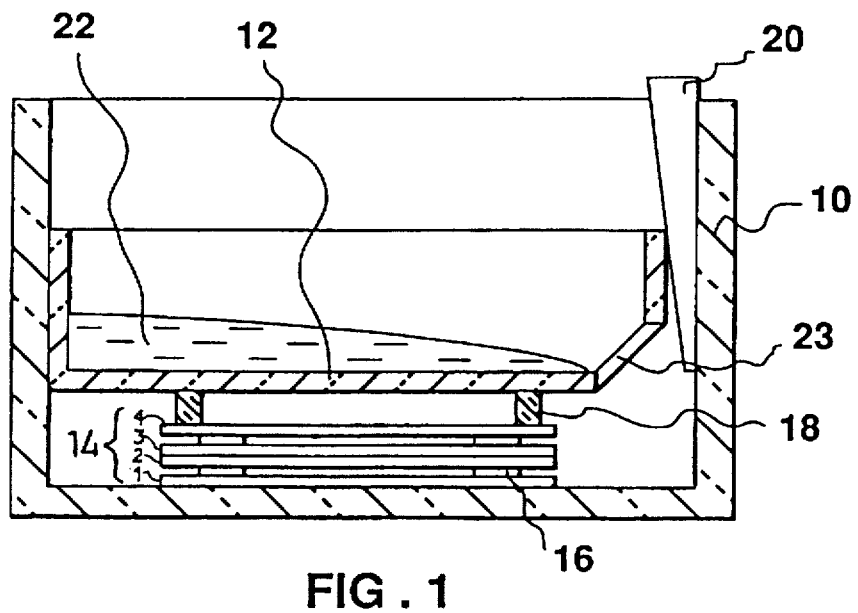
FIG. 1 is a side view of a double-boat configuration which may be used in methods according to the present invention.
Figure 2:
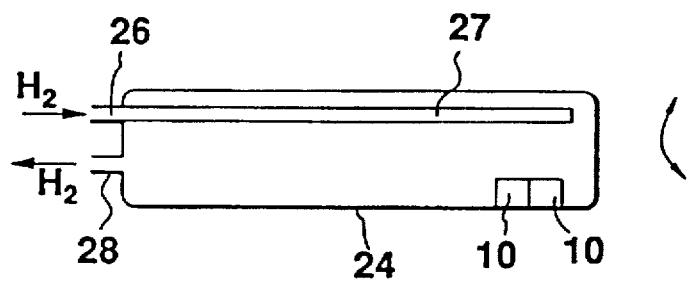
FIG. 2 is a side view of a reactor which may be used in methods according to the present invention.
Figure 3:
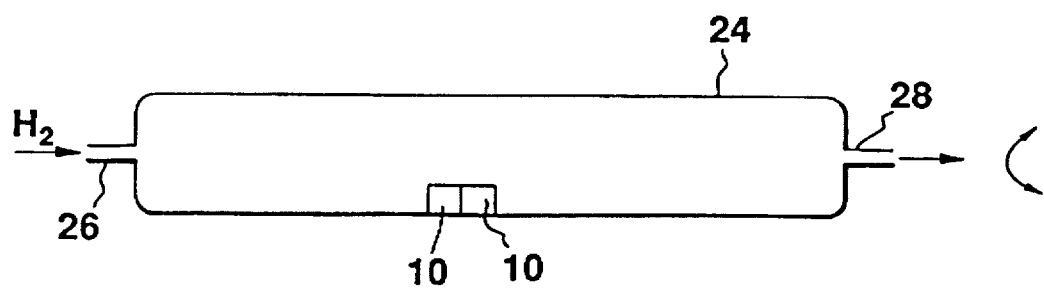
FIG. 3 is a side view of an alternative configuration of a reactor.

Referring now to the drawing, FIGS. 1-3 illustrate two of the possible laboratory set-ups which may be used to carry out the methods according to the present invention. Many other such set-ups may be used which employ the principles of the present invention. Similarly, it will be appreciated that commercial methods, including continuous, rather than batch, processing, is possible. The laboratory set-ups described herein are presented for illustrative purposes only and it is not intended that they in any way limit the scope of the present invention.

Shown in FIG. 1 is a double boat unit which is useful in carrying out the fabrication of p-i-n structures according to the present invention. The unit is made up of a larger substrate boat 10 and a smaller melt boat 12 which is sized and dimensioned so as to fit within substrate boat 10 as shown in FIG. 1. Substrate boat 10 and melt boat 12 may each be made of any suitable material. Preferably, each is made of quartz (silicon dioxide).

Placed on the bottom of substrate boat 10 is a piece of substrate 14 of any desirable shape, size and thickness. Preferably, substrate 14 has thickness of from about 0.25 to about 0.6 mm. Typically, substrate 14 is square or circular in top view and has an area of from about 3 to about 50 cm$^2$, with the surface to be treated being well polished.

Since the spreading of the melt is preferably carried out through capillary forces, as described below, it is preferable to have one or more pairs of substrates 14 with adjoining faces to be treated separated by a suitable distance, H. Substrates 14 may be of any appropriate material, such as a III-V compounds, preferably gallium arsenide. Substrates 14 may have previously undergone any suitable treatment, such as doping with any suitable dopant to any desired concentration. For example, substrates 14 may be p$^+$, n− or semi-insulating. Shown in FIG. 1 are two pairs of substrates 14, which can be conveniently referred to as 1, 2, 3, and 4 starting with the bottom substrate. Substrates 1 and 2 form one pair, while substrates 3 and 4 form the second pair. The upper face of substrate 1 and lower face of substrate 2 are to be treated, as are the upper face of substrate 3 and lower face of substrate 4. The other faces of the substrates will remain untreated, although it may, under certain circumstances, be desirable to simultaneously treat both faces of the same substrate.

The gap, H, between adjoining faces of each pair of substrates 14 is maintained by providing suitable spacers 16, preferably located near the periphery of substrates 14 and preferably of small extent. The gap, H, may be of any suitable magnitude. Preferably H is from about 0.1 mm to 5.0 mm. The gap, H, is set so as to allow the rapid and uniform coating of the substrate surface with the melt through the action of capillary forces.

Located above the top substrate is a melt boat base 18 on which melt boat 12 rests. It is preferable to include wedging members 20 which serve to wedge melt boat 12 and immobilize it relative to substrate boat 10.

Into melt boat 12 are placed certain materials 22, typically in the solid state. Materials 22 include a suitable amount of gallium arsenide solid and a suitable solvent, which may at room temperature be a solid or a liquid. The relative amounts of gallium arsenide and solvent should be such that, at the appropriate annealing temperature, there is sufficient gallium arsenide to saturate the solvent. Any suitable solvent may be used, such as Ga or Bi. Preferably the solvent is gallium, which has a melting point of approximately 31° C.

Melt boat 12 features an opening 23 near its lower portion which allows materials 22, when in the molten state, to pour out of melt boat 12 and into substrate boat 10 when the unit is tilted to a certain extent, as described below.

The unit shown in FIG. 1, equipped with properly mounted substrates 14 and charged with the appropriate amount of gallium arsenide and solvent, is inserted into a reactor 24 (shown in FIGS. 2 and 3). Reactor 24 may be of any suitable size and shape. Preferably, reactor 24 is cylindrical in shape, with an internal diameter, d, a volume V$_o$, and with ends which are closed off, except for a gas inlet 26 and a gas outlet 28.

Two alternative configurations of reactor 24 are shown in FIGS. 2 and 3. In the configuration of FIG. 2 is shown a gas inlet 26 which extends, preferably via a quartz tube 27 having an inner diameter, d, into the reactor 24 and which serves to release the gases at a point near the far end of reactor 24. In this configuration, gas outlet 28 is preferably placed at the same end of reactor 24 as gas inlet 26 so as to force gases to traverse the entire length of reactor 24 prior to exiting the system. As will be seen below, the tube diameter, d, takes the place of the internal diameter, d, of reactor 24 in the calculations, and has therefore been designated by the same notation.

In the alternative configuration of FIG. 3 is shown a gas inlet 26 which releases the gases at a point just inside the near end of reactor 24. In this configuration, gas outlet 28 is preferably placed at the end of reactor 24 opposite the end at which gas inlet 26 is found, to again force gases to traverse the entire length of reactor 24 prior to exiting the system.

One or more units are inserted into reactor 24 and are oriented so that substrates 14 are substantially horizontally oriented. In this position, materials 22, even when in the molten condition, are unable to flow through opening 23 out of melt boat 12 and into substrate boat 10.

Reactor 24 is preferably rotatable about its longitudinal axis, which makes it possible, when desired, to rotate reactor 24 to a desired in either a clockwise or a counterclockwise sense.

The process of creating a p-i-n structure on the substrate surfaces is that of Liquid Phase Epitaxy (LPE). LPE is a crystal growth technique which involves the near-equilibrium growth of GaAs and other compounds from a saturated solution which is placed in contact with a polished substrate, generally GaAs. Just before or just after the surface of the substrate has been coated, the temperature is lowered from the equilibrium temperature at a controlled rate bringing on supersaturation of the solution and leading to precipitation and epitaxial growth of the dissolved material onto the substrate.

To carry out the LPE according to the present invention, reactor 24 is heated, typically in a suitable oven, to a suitable temperature, preferably between about 900° C. and about 950° C. The heating takes place over a period of from 10 to 120 minutes. During the heating, any solid solvent present, such as gallium, melts. The gallium arsenide subsequently dissolves into the solvent, forming a saturated solution of gallium arsenide in the solvent.

Once the desired temperature, T, is reached, the temperature is maintained at a constant level for an annealing period, t, of from about 30 to about 3000 minutes, depending on the application.

During the annealing period, gas, made up primarily of hydrogen, is allowed to flow at a suitable rate, F$_{H2}$, into reactor 24 through gas inlet 26 and to come in contact with the quartz present in the system and with solution in melt boat 12. The gas also contains an appropriate amount of water vapor. The concentration of water vapor in the gas exiting reactor 24 through gas outlet 28 is given by q$_{H2O}$.

For purpose of calculations which are described below, the effective length, l, of reactor 24, or alternatively, the length of quartz tube 27, is that length of either reactor 24 or quartz tube 27 which is substantially at the annealing temperature.

Without in any way limiting the scope of the present invention, it is believed that the hydrogen, water vapor and the quartz (silicon dioxide) take part in, or otherwise influence, a series of reactions, including, but not limited to, $SiO_2 + 2H_2 \rightarrow Si + 2H_2O$
$SiO_2 + H_2 \rightarrow SiO + H_2O$
$Ga + 2H_2O \rightarrow Ga_2O + 2H_2$, etc.

which tend to produce various components, some of which are integrated into the melt in melt boat 12 and later become part of the p-i-n structure.

After a suitable annealing time, t, the melt, of mass $M_{Ga}$, which now contains various trace components, is ready to be coated onto substrates 14. This coating can be achieved in any convenient fashion. In the case of the systems illustrated in FIGS. 1–3, coating is achieved by rotating reactor 24 a sufficient amount, typically 20–30 degrees, to allow the melt to leave melt boat 12 through opening 23 and enter substrate boat 10 where the melt contacts the edges of substrates 14. Once the melt has entered substrate boat 10, reactor 24 is rotated in the opposite sense, typically to approximately 10 degrees from the horizontal, to facilitate the entry of the melt into the gaps between opposing substrate faces. Reactor 24 is subsequently rotated back to its original horizontal orientation.

Capillary forces generated by each pair of opposed substrate faces serve to draw the melt into the gap between the faces and spread the melt evenly. To allow sufficient time for the melt to distribute evenly between the horizontal substrates, it is preferable to wait from about 30 minutes to about 60 minutes, to allow the flow and temperature to equilibrate, before proceeding with the cooling process which is described below.

The apparatus is then cooled at a controlled rate, which depends on the application, preferably substantially linearly, from the annealing temperature to room temperature. Preferably, the rate of cooling, $V_c$, should be tightly controlled down to a temperature of from about 600° to about 650° C. The subsequent cooling can be achieved, for example by turning off the oven and allowing the cooling to proceed as the oven loses heat to its surroundings.

During cooling, gallium arsenide and the various trace components, precipitate and deposit epitaxially in a thin layer onto the exposed surfaces of substrates 14.

After cooling, coated substrates 14 are removed from the unit and their surfaces are cleaned of any excess solvent which might be present. Substrates 14 now contain an epitaxial layer which features a p-i-n structure.

The surface may now be polished or otherwise treated using conventional techniques, such as lithography and etching, to put it is a form which is useful for incorporation into a variety of electronic devices.

Without in any way limiting the scope of the present invention, it has been found through theoretical development and exhaustive empirical data that the thickness of the i region, $W_i$ (in μm) is described by, $$W_i = AH(8.9 \cdot 10^{-4} T - 1)\cdot(x^2 + 5.65x + 8.95)$$

where,

A is an empirical constant having a value of from about 0.014 to about 0.018; and $$x = \log M_{H2O} = \log \{[0.344 q_{H2O}(F_{H2}T + V_o)/M_{Ga}]l/d\}$$

where $M_{H2O}$ is the mass of water vapor in hydrogen relative to mass of melt-solution $M_{Ga}$ (mg/g), and where H is the gap width between adjoining faces of a pair of substrates (μm)

T is the temperature at which the annealing is carried out (K)

t is the annealing time (min)

$F_{H2}$ the flow rate of hydrogen (m³/min)

$q_{H2O}$ is the concentration of water vapor in hydrogen, measured at the outlet of the reactor (mg/m³)

$M_{Ga}$ is the mass of the solution in the reactor (g)

l is the length of the reactor held at the annealing temperature (cm)

d is the internal diameter of the reactor (cm)

$V_o$ is the volume of the reactor (m³).

Without in any way limiting the scope of the present invention, it has been found through theoretical development and exhaustive empirical data that the thickness of the p region, $W_p$ (in μm) is described, for the case where the substrate is gallium arsenide doped with zinc of a concentration of from about $5 \cdot 10^{19}$ to about $1.2 \cdot 10^{20}$ cm⁻³, and where the annealing takes place at a temperature of from about 890° to about 910° C., by, $$W_p = BH^{0.98} x^3 \exp(-1.5x)$$

where,

B = 0.14 to 0.17

$x = 3 + \log M_{H2O}$.

Further, the thickness of the p region, $W_p$ (in μm) is described, for the case where the substrate is gallium arsenide doped with zinc of a concentration of from about $5 \cdot 10^{18}$ to about $1.2 \cdot 10^{19}$ cm⁻³, and where the annealing takes place at a temperature of from about 890° to about 910° C., by, $$W_p = CH^{0.98} x^4 \exp(-2.5x)$$

where

C = 0.4 to 0.5

$x = 3 + \log M_{H2O}$.

Further, the thickness of the p region, $W_p$ (in μm) is described, for the case where the substrate is gallium arsenide doped with zinc of a concentration of from about $5 \cdot 10^{18}$ to about $1.2 \cdot 10^{19}$ cm⁻³, and where the annealing takes place at a temperature of from about 940° to about 960° C., by, $$W_p = DH^{0.98} x^3 \exp(-1.5x)$$

where

D = 0.18 to 0.22

$x = 3 + \log M_{H2O}$.

Further, the thickness of the p region, $W_p$ (in μm) is described, for the case where the substrate is gallium arsenide doped with zinc of a concentration of less than about $10^{18}$ cm⁻³, or the substrate is gallium arsenide which is doped with tin, silicon, chromium or oxygen of any concentration, and where the annealing takes place at a temperature of from about 940° to about 960° C., by, $$W_p = EH^{0.98}(6 - 5x - 9x^2) \text{ for } -1.15 \leq x \leq 0.6$$

$W_p = 0$ for $x > 0.6$ or $x > -1.15$ where $E = 0.011$ to $0.015$ $x = 1.1 + \log M_{H2O}$.

Thicknesses of the p region for temperatures other than those given above and for dopant concentrations different than those indicated may be readily approximated by interpolation or extrapolation of the above equations.

GaAs p-i-n structure such as those described herein may be useful in a large number of applications. For illustrative purposes, several such applications will be briefly discussed in what follows.

P-i-n Diode

Figure 4:
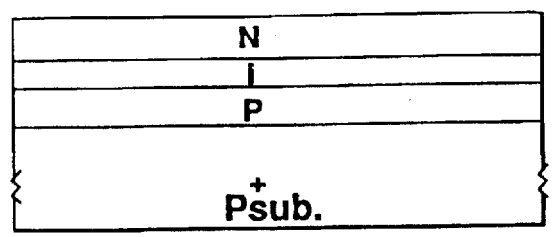
FIG. 4 is a schematic representation of a diode element according to the present invention.

Methods and devices according to the present invention may be used to fabricate a superior diode. Such a diode is shown schematically in FIG. 4 and is seen to consist of a p-i-n structure grown onto a $p^+$ substrate.

The following table includes structure geometry and parameters of LPE processes for producing such diodes for three different reverse voltage ranges.

| Reverse voltage (V) | 200–700 | 700–1500 | 1500–2000 |
|---|---|---|---|
| $W_p$ (μm) | 10–40 | 40–100 | 40–70 |
| $W_i$ (μm) | 3–15 | 15–55 | 55–70 |
| $W_n$ (μm) | 15–30 | 30–50 | 40–60 |
| $\tau_p$ (ns) | 15–50 | 20–60 | 20–40 |
| Substrate | GaAs:Zn | GaAs:Zn | GaAs:Zn |
| Concentration (cm−3) | | $5 \cdot 10^{18}$ to $1.2 \cdot 10^{19}$ | |
| T (C.) | | 940 to 970 | |
| H (mm) | .4–.8 | 1.0–2.0 | 2.0–3.0 |
| $M_{H2O}$ (mg/g) | 1–10 | 1–20 | 5–40 |
| $V_c$ in the range of T to 700° C. (K/min) | ≦0.6 | ≦0.4 | ≦0.3 |
| t (min) | | >120 | | where, $\tau_p$ is the minority carrier lifetime.

The main observed performance parameters of such diodes, compared with conventional Si diodes, are as follows:

| | Si | GaAs |
|---|---|---|
| $T_{jmax}$ (°C.) | 120–150 | 260–300 |
| $J_{FM}$ (A/cm$^2$) | 100 | 500 |
| $V_{FM}$ (V) | 1.3–1.8 | 1.3–1.8 |
| $t_{rr}$ (ns) | 30–70 | 30–70 |
| $V_{BR}$ (V) | ≦800 | ≦2000 | where, $T_{jmax}$ is maximum junction temperature.

$J_{FM}$ is peak forward current density.

$V_{FM}$ is peak forward voltage drop.

$t_{rr}$ is reverse recovery time at room temperature, forward current 1A, dI/dt=100 A/μsec.

$V_{BR}$ is breakdown voltage.

The comparison shows the clear advantages of the GaAs diodes in junction and case temperatures, breakdown voltage and reverse recovery time and particularly in combinations of these in one diode. Moreover, it can be shown theoretically that some parameters of GaAs diodes should be much better than the measured values shown in the table. It is well known that the size of the band gap $E_g$ determines the intrinsic carrier concentration $n_i$ at a given T (the larger $E_g$, the smaller $n_i$ and the higher the operating temperature $T_j$). $E_g$ also determines the avalanche breakdown voltage $V_{BR}$ and the reverse current.

The rectification capability of GaAs diodes is preserved up to 300° C., while Si p-n junctions have reverse current values one to two orders of magnitude higher than GaAs in the temperature range 20°–170°C. The larger $E_g$ of GaAs also improves the radiation hardness by a factor of 5–10 over Si. One drawback of increasing $E_g$ is the increase in the contact potential of the p-n junction which causes larger voltage drop. However, both theoretically and experimentally it may be shown that a low voltage drop is connected to electron-hole scattering and to effects of internal recombination radiation on the modulation of a base region. These factors should enable us to get a significantly smaller voltage drop in GaAs than in Si at high current densities, which smaller drop reduces forward conduction losses. Moreover, in contrast with Si, the reverse recovery time in GaAs diodes is practically independent of temperature.

Thermosensor

Figure 5:
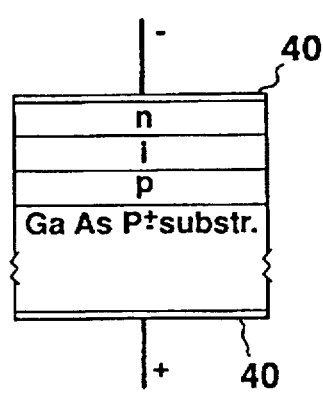
FIG. 5 is a schematic representation of a thermosensor element according to the present invention.
Figure 6:
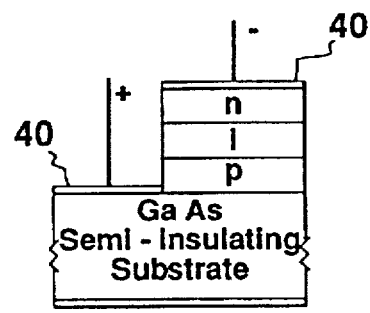
FIG. 6 is a schematic representation of another thermosensor element according to the present invention.

Methods and devices according to the present invention may be used to fabricate a superior thermosensor. Two embodiments of such a thermosensor are shown schematically in FIGS. 5 and 6. In one case (FIG. 5) the structured includes a p-i-n structure build onto a GaAs $p^+$substrate where both sides of the device are metallized to form a metal layer 40. In the other case (FIG. 6) the substrate is a GaAs semi-insulator. Here a window is cut through the n and i regions and a portion of the p region and metallization is effected on the exposed p region and on the n region.

The preferable geometry of such a thermosensor is:

$W_p = 10$ to 25 micrometers $W_i = 1$ to 5 micrometers $W_n = 10$ to 25 micrometers The following table includes parameters of LPE processes for producing four illustrative thermosensors, using a different substrate, a different substrate dopant concentration and/or a different annealing temperatures. In each case, the sensor area (in cm$^2$) is preferably greater than or equal to the larger of:

$[(3 \text{ to } 15)I_F]^{0.5}$ and $(10 \text{ to } 50)I_F$ wherein $I_F$ is the forward current in amperes.

| | I | II | III | IV |
|---|---|---|---|---|
| Structure | $p^+$-p-i-n | $p^+$-p-i-n | $p^+$-p-i-n | semi-ins.-p-i-n |
| Substrate | GaAs:Zn | GaAs:Zn | GaAs:Zn | GaAs:Cr |
| Concentration (cm−3) | $5 \cdot 10^{19}$ to $1.2 \cdot 10^{20}$ | $5 \cdot 10^{18}$ to $1.2 \cdot 10^{19}$ | $5 \cdot 10^{18}$ to $1.2 \cdot 10^{19}$ | (semi-insulating) |
| T (C.) | 890 to 910 | 890 to 910 | 940 to 960 | 940 to 960 |
| H (mm) | .3–.8 | .3–.8 | .2–.4 | .2–.4 |
| $M_{H2O}$ (mg/g) | 2.7–2.9 | .2–.3 | .8–.9 | .12–.14 |
| $V_c$ in the range of T to T-50 (K/min) | ≦0.4 | ≦0.4 | ≦0.4 | ≦0.4 |
| t (min) | 120–180 | 120–180 | 120–180 | 120–180 |

There are currently many types of temperature sensors, including semiconductor-based (Si) thermosensors. In contrast with these, the GaAs sensor according to the present invention includes a p-i-n structure grown by LPE. The thermal sensitivity comes from temperature changes in the forward voltage drop at small values of the forward current.

The main performance parameters of thermosensor according to the present invention are:

| Working temperature range (with linear characteristic) | −60 to 350° C. |
|---|---|
| Minimum sensitivity | 2.4 +/− 0.2 mV/C |
| Voltage at 25° C. | 0.90 +/− 0.05 V |
| Maximum sensor current | |
| (diameter of 3 mm) | 0.5 mA |
| (diameter of 6 mm) | 5 mA |
| Accuracy (without compensation or differential geometry) | |
| (absolute) | +/−0.5° C. |
| (relative) | +/−0.2° C. |
| Maximum permissible current instability (without deterioration of accuracy) | +/−5% |
| Maximum possible deflection from linear characteristics | +/−0.2% |
| Maximum permissible current overload (for 10 sec) | 1 A |
| Inertness (packaged sensor) | 0.01 to 0.1 sec |

The main advantages of thermosensors according to the present invention are:

Wide temperature range;

Linear characteristics;

Small mass to size ratio;

Insensitive to HF interference up to 3 MHz;

High speed operation;

Capable of measuring exact temperature differences when connected in a differential pair;

Operation in severe or difficult environments.

Neutron Detector

Figure 7:
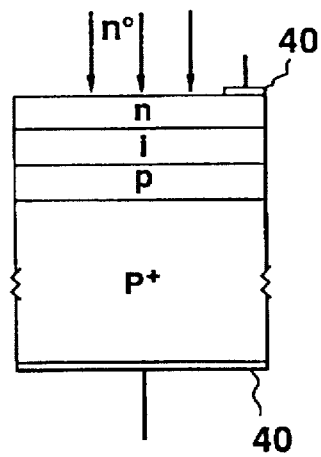
FIG. 7 is a schematic representation of a neutron detector element according to the present invention.

Methods and devices according to the present invention may be used to fabricate a superior neutron detector. An example of one such a neutron detector is shown schematically in FIG. 7. Here the p-i-n structure is grown onto a p$^+$ substrate. Metallization is of the back surface of the substrate and of a portion of the n region. Neutrons are received through the exposed surface of the n region.

The preferable geometry of such a neutron detector is:

$W_p$=45 to 75 micrometers $W_i$=60 to 80 micrometers $W_n$=40 to 60 micrometers.

Such a neutron detector has a minority carrier lifetime, $\tau_p$, of from about 1 to about 5 ns and a reverse current at 200 V of less than $10^{-7}$ A at room temperature and less than $10^{-5}$ at 200° C.

The following table includes parameters of LPE processes for producing an illustrative neutron detector.

| Structure | p$^+$-p-i-n |
|---|---|
| Substrate | GaAs:Zn |
| Concentration (cm−3) | 5 · 10$^{18}$ to 1.2 · 10$^{19}$ |
| T (C.) | 940 to 960 |
| H (mm) | 3.0 to 3.2 |
| M$_{H2O}$ (mg/g) | 8 to 10 |
| V$_c$ in the range of T to 700° C. (K/min) | ≦0.3 |
| t (min) | 330–390 |

The main performance parameters of such a neutron detector are:

| Sensitivity | same as that of Si—Li sensors |
|---|---|
| Stability to neutron flow | up to 10$^{15}$ cm$^{-2}$ |
| Dark current | ≦0.01 mA |
| Working voltage range | 0–200 V |
| Maximum operating temperature | 200° C. |
| Size | 0.5 to 1 cm$^2$ |

The main advantages of such a neutron detector are:

Sensitivity times stability product up to 200 times higher than the best Si sensors;

Sensitivity independent of neutron energy;

Much higher operating temperature (200° C.) than Si sensors (140° C.);

Small dark current.

Gamma Detector

Figure 8:
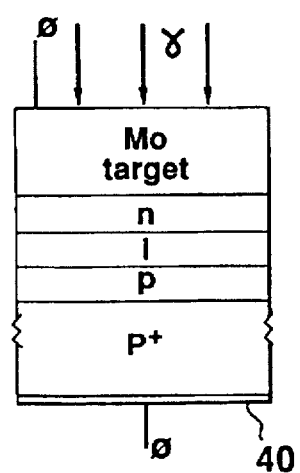
FIG. 8 is a schematic representation of a gamma detector element according to the present invention.

Methods and devices according to the present invention may be used to fabricate a superior gamma detector. An example of one such a gamma detector is shown schematically in FIG. 8. Here the p-i-n structure is grown onto a p$^+$ substrate. A Mo target is superimposed on the surface of the n region. Metallization is of the back surface of the substrate. Gamma rays are received by the Mo target.

The preferable geometry of such a gamma detector is:

$W_i$=10 to 20 micrometers $W_n$=20 to 40 micrometers

Such a gamma detector has a minority carrier lifetime, $\tau_p$, of from about 50 to about 200 ns.

The following table includes parameters of LPE process for producing an illustrative gamma detector.

| Structure | p$^+$-p-i-n |
|---|---|
| Substrate | GaAs:Zn |
| Concentration (cm−3) | 5 · 10$^{18}$ to 1.2 · 10$^{19}$ |
| T (C.) | 940 to 960 |
| H (mm) | 1.4 to 1.6 |
| M$_{H2O}$ (mg/g) | 0.26 to 0.55 |
| V$_c$ in the range of T to 700° C. (K/min) | ≦1.0 |
| t (min) | 150–200 |

The main advantages of this gamma detector are:

Small dark current

Much higher operating temperature than Si-based detectors

High sensitivity

Opto-Modulator

Figure 9:
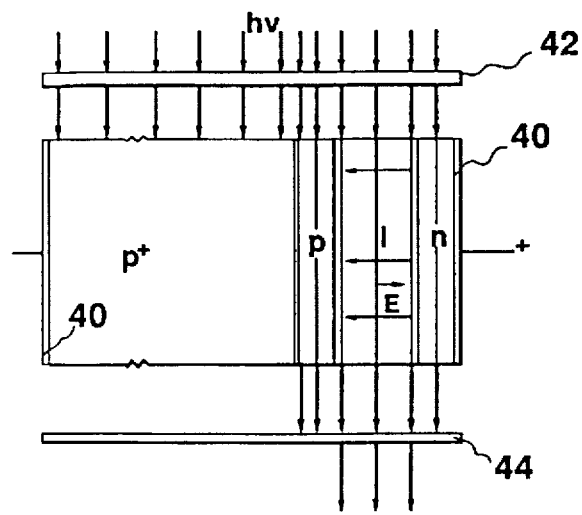
FIG. 9 is a schematic representation of an opto-modulator element according to the present invention.
Figure 10:
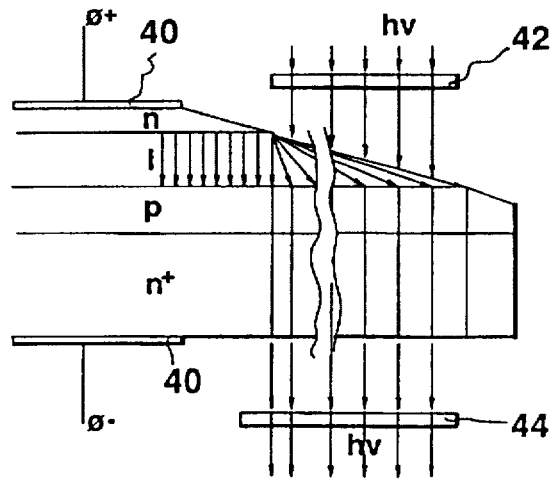
FIG. 10 is a schematic representation of another opto-modulator element according to the present invention.

Methods and devices according to the present invention may be used to fabricate a superior opto-modulator. Two examples of such opto-modulators are shown schematically in FIGS. 9 and 10. In each case the p-i-n structure is grown onto a p$^+$ substrate. In each case, light is plane-polarized, using a polarizer 42, and enters the device. Light leaving the device goes through an analyzer 44 and is subsequently measured by a detector. In the configuration of FIG. 9 light enters the device parallel to the layer boundaries. To increase the usable area through which light can enter the device and be operative, it may be desirable, as shown in the configuration of FIG. 10, to have the light enter the device perpendicular to the layer boundaries and to cut the n and i region along a very small angle so as to expose a large projection area of the i region.

The preferable geometry of such an opto-modulator is:

$W_p$=20 to 40 micrometers $W_i$=20 to 60 micrometers

The following table includes parameters of LPE processes for producing an illustrative opto-modulator.

| Structure | p$^+$-p-i-n |
|---|---|
| Substrate | GaAs:Zn |
| Concentration (cm−3) | $5 \cdot 10^{18}$ to $1.2 \cdot 10^{19}$ |
| T (C.) | 940 to 960 |
| H (mm) | 3.0 to 3.2 |
| M$_{H2O}$ (mg/g) | 2.0 to 2.5 |
| V$_c$ in the range of T to 700° C. (K/min) | ≦0.3 |
| t (min) | 240–300 |

The main advantages of this device are:

Low modulating voltage (less than 50 V)

High response speed

High temperature stability

No need for special temperature stabilization equipment

High operating temperatures (up to 300° C.)

Asymmetrical Thyristor

Figure 11:
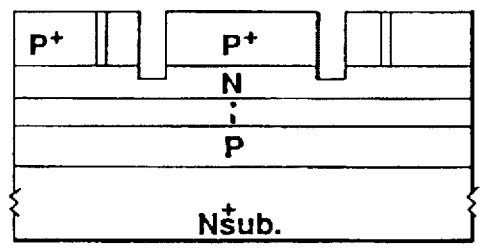
FIG. 11 is a schematic representation of an asymmetrical thyristor element according to the present invention.

Methods and devices according to the present invention may be used to fabricate a superior asymmetrical thyristor. An example of such an asymmetrical thyristor is shown schematically in FIG. 11. Here, the p-i-n structure is grown onto a n+ substrate and a p$^+$ layer, which serves as the emitter gate is subsequently grown onto the n region.

The following table includes parameters of LPE processes for producing an illustrative asymmetrical thyristor, along with parameters for each of the layers/regions making up the structure.

| Structure | Material | Conc. (cm$^{-3}$) | Thick. (μm) |
|---|---|---|---|
| N$^+$sub | GaAs | >10$^{18}$ | |
| P$_{base}$ | GaAs | 10$^{15}$–10$^{16}$ | 15–60 |
| i$_{base}$ | GaAs | <10$^{12}$ | 10–30 |
| N$_{base}$ | GaAs | 10$^{15}$–10$^{16}$ | 20–40 |
| P$^+_{emit}$ | GaAs | >10$^{19}$ | 3–10 |
| Substrate | | GaAs:Sn, GaAs:Si | |
| Concentration (cm−3) | | $1 \cdot 10^{18}$ to $5 \cdot 10^{18}$ | |
| T (C.) | | 940 to 970 | |
| H (mm) | | 1.3 to 3.5 | |
| M$_{H2O}$ (mg/g) | | 0.15 to 0.30 | |

-continued

| Structure | Material | Conc. (cm$^{-3}$) | Thick. (μm) |
|---|---|---|---|
| V$_c$ in the range of T to 700° C. (K/min) | | <0.5 | |
| t (min) | | >120 | |

All the layers/regions may be fabricated by LPE. The p$^+$ layer may be fabricated by a separate LPE treatment or by diffusion.

For better regulation of the geometry of the structure it is preferably to add Zn vapor to the reactor during LPE processing. The main performance parameters of the asymmetrical thyristor are:

| J$_{TM}$ | 400–500 A/cm$^2$ |
|---|---|
| V$_{DM}$ | 800 V |
| T$_j$ | 220° C. |
| t$_q$ | 2–5 μsec |
| dV/dt$_{crit.}$ | >1000 V/μsec |
| dI/dt$_{crit.}$ | 500–1000 A/μsec | where,

J$_{TM}$ is maximum on-state current density,

V$_{DM}$ is maximum off-state voltage, t$_q$ is turn-off time, dV/dt$_{crit.}$ is critical rate of rise of off-state voltage dI/dt$_{crit.}$ is critical rate of rise of the on-state current The main advantages of this asymmetrical thyristor are:

High operating junction (storage) temperature range

Fast switching time

High values of dV/dt and di/dt

Opto-Thyristor

Figure 12:
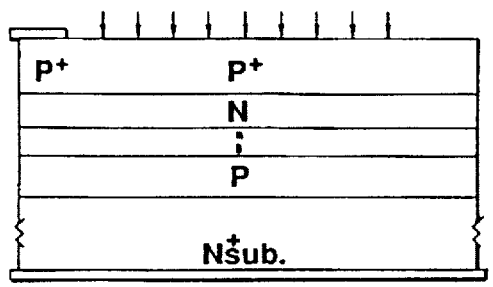
FIG. 12 is a schematic representation of an opto-thyristor element according to the present invention.

Methods and devices according to the present invention may be used to fabricate a superior opto-thyristor. An example of such an opto-thyristor is shown schematically in FIG. 12. Here the p-i-n structure is grown onto an n+ substrate with a p$^+$ layer subsequently grown onto the n region. The n+ substrate is metallized to form a metal surface 40 which serves as the cathode while a portion of the p$^+$ layer is metallized to form a metal surface 40 which serves as the anode.

The following table includes parameters of LPE processes for producing an illustrative opto-thyristor, along with parameters for each of the layers/regions making up the structure.

| Structure | Material | Conc. (cm$^{-3}$) | Thick (μm) |
|---|---|---|---|
| N$^+$sub | GaAs | >10$^{18}$ | |
| P$_{base}$ | GaAs | 10$^{15}$–10$^{16}$ | 10–100 |
| i$_{base}$ | GaAs | <10$^{12}$ | 25–40 |
| N$_{base}$ | GaAs | 10$^{15}$–10$^{16}$ | 20–40 |
| P$^+_{emit}$ | Ga$_x$Al$_{1-x}$As | >10$^{18}$ | 1–10 |
| Substrate | | GaAs:Sn, GaAs:Si | |
| Concentration (cm−3) | | $1 \cdot 10^{18}$ to $5 \cdot 10^{18}$ | |
| T (C.) | | 940 to 970 | |
| H (μm) | | 2.5 to 5.0 | |
| M$_{H2O}$ (mg/g) | | 0.20 to 0.35 | |

-continued

| Structure | Material | Conc. (cm$^{-3}$) | Thick (μm) |
|---|---|---|---|
| $V_c$ in the range of T to 700° C. (K/min) | | <0.3 | |
| t (min) | | | >120 |

All layers/regions are fabricated by LPE. For better regulation of the geometry of the structure, Zn vapor can be added to the reactor during LPE processing. The main performance parameters of this opto-thyristor are:

| | |
|---|---|
| $J_{TPM}$ | 500–4000 A/cm$^2$ |
| $V_{TM}$ | 5–10 V |
| $V_{DM}$ | 500–1000 V |
| $t_r$ | 10–20 ns |
| $T_{jmax}$ | 220° C. |
| $dI/dt_{crit}$ | $(0.5–4.0) \cdot 10^{10}$ A/sec | where, $J_{TPM}$ is maximum peak on-state current density (pulse time 20–1000 ns).

$V_{TM}$ is maximum on-state voltage.

$t_r$ is rise time.

The main advantages of this opto-thyristor are:

Low forward voltage drop

High operating junction (storage) temperature range

Fast switching time

High values of dV/dt and dI/dt

While the invention has been described with respect to one preferred embodiment, it will be appreciated that many variations, modifications and other applications of the invention may be made.

What is claimed is:

1. A method of simultaneously forming a gallium arsenide p-i-n structure having p, i and n regions in one epitaxial layer of GaAs, comprising:
   (a) heating to dissolve gallium arsenide in a solvent to form a saturated solution of gallium arsenide in said solvent;
   (b) contacting said solution with a gaseous mixture, which mixture includes hydrogen, water vapor and products of reactions between said hydrogen and said water vapor with said solvent and with silicon dioxide, to form a contacted solution;
   (c) coating at least one suitably selected substrate with said contacted solution;
   (d) cooling said coated substrate to precipitate gallium arsenide from said contacted solution onto said substrate thereby forming an epitaxial layer of GaAs having a p-i-n structure;
   (e) removing said substrate coated with a layer of gallium arsenide having a p-i-n structure which constitutes the product, the p-i-n structure having an i region with a dopant concentration of less than about $10^{12}$ cm$^{-3}$.

2. A method as in claim 1 wherein said solvent is bismuth or gallium.

3. A method as in claim 2 wherein said solvent is gallium.

4. A method as in claim 1 wherein said substrate is a III-V compound.

5. A method as in claim 4 wherein said substrate is gallium arsenide.

6. A method as in claim 5 wherein said substrate is p$^+$ gallium arsenide.

7. A method as in claim 5 wherein said substrate is n– gallium arsenide.

8. A method as in claim 5 wherein said substrate is semi-insulating gallium arsenide.

9. A method as in claim 1 wherein at least one pair of said substrates is processed simultaneously, the faces to be coated of each of said pairs of substrates facing each other and being spaced from each other, wherein said contacting takes place in a suitably shaped and sized reactor; and wherein the gallium arsenide p-i-n structure is characterized in having an i region of thickness, $W_i$ (μm), given by, $$W_i = AH(8.9 \cdot 10^{-4} T - 1) \cdot (x^2 + 5.65x + 8.95)$$

where,

A is an empirical constant having a value of from about 0.014 to about 0.018; and $x = \log M_{H2O}$ where $M_{H2O}$ is the mass of water vapor in hydrogen relative to mass of melt-solution $M_{Ga}$ (mg/g) and is given by, $$M_{H2O} = [0.344 q_{H2O}(F_{H2}t + V_0)/M_{Ga}] l/d$$

and where

H is the gap width between adjoining faces of said pair of substrates (μm)

T is the temperature at which said contacting is carried out (K)

t is said contacting time (min)

$F_{H2}$ the flow rate of said hydrogen (m$^3$/min)

$q_{H2O}$ is the concentration of said water vapor in said hydrogen, measured at the outlet of said reactor (mg/m$^3$)

$M_{Ga}$ is the mass of said solution in said reactor (g)

l is the length of said reactor, held at said contacting temperature (cm)

d is the internal diameter of said reactor (cm)

$V_o$ is the volume of said reactor (m$^3$).

10. A method as in claim 9 wherein:

at least one pair of said substrates is processed simultaneously, the faces to be coated of each of said pairs of substrates facing each other and being spaced from each other;

wherein said contacting takes place in a suitably shaped and sized reactor;

wherein said substrate is gallium arsenide which is doped with zinc of a concentration of from about $5 \cdot 10^{19}$ to about $1.2 \cdot 10^{20}$ cm$^{-3}$;

wherein said contact takes place at a temperature of from about 890° to about 910° C.; and wherein the gallium arsenide p-i-n structure is characterized in having a p region of thickness, $W_p$ (μm), given by, $$W_p = BH^{0.98} x^3 \exp(-1.5x)$$

wherein,

B = 0.14 to 0.17

$x = 3 + \log M_{H2O}$.

11. A method as in claim 9 wherein:

at least one pair of said substrates is processed simultaneously, the faces to be coated of each of said pairs of substrates facing each other and being spaced from each other;

wherein said contacting takes place in a suitably shaped and sized reactor;

wherein said substrate is gallium arsenide which is doped with zinc of a concentration of from about $5 \cdot 10^{18}$ to about $1.2 \cdot 10^{19}$ cm$^{-3}$;

wherein said contact takes place at a temperature of from about 890° to about 910° C.; and wherein the gallium arsenide p-i-n structure is characterized in having a p region of thickness, $W_p$ (μm), given by, $$W_p = CH^{0.98} x^4 \exp(-2.5x)$$

wherein
C=0.4 to 0.5
x=3+log $M_{H2O}$.

12. A method as in claim 9 wherein:

at least one pair of said substrates is processed simultaneously, the faces to be coated of each of said pairs of substrates facing each other and being spaced from each other;

wherein said contacting takes place in a suitably shaped and sized reactor;

wherein said substrate is gallium arsenide which is doped with zinc of a concentration of from about $5.10^{18}$ to about $1.2 \cdot 10^{19}$ cm$^{-3}$;

wherein said contact takes place at a temperature of from about 940° to about 960° C.; and wherein the gallium arsenide p-i-n structure is characterized in having a p region of thickness, $W_p$ (μm), given by, $$W_p = DH^{0.98} x^3 \exp(-1.5x)$$

wherein
D=0.18 to 0.22
x=3+log $M_{H2O}$.

13. A method as in claim 9 wherein:

at least one pair of said substrates is processed simultaneously, the faces to be coated of each of said pairs of substrates facing each other and being spaced from each other;

wherein said contacting takes place in a suitably shaped and sized reactor;

wherein said substrate is gallium arsenide which is doped with zinc of a concentration of less than or equal to about $10^{18}$ cm$^{-3}$;

wherein said contact takes place at a temperature of from about 940° to about 960° C.; and wherein the gallium arsenide p-i-n structure is characterized in having a p region of thickness, $W_p$ (μm), given by, $$W_p = EH^{0.98}(6-5x-9x^2) \text{ for } -1.15 \leq x \leq 0.6$$

$$W_p = 0 \text{ for } x > 0.6 \text{ or } x < -1.15$$

wherein
E=0.011 to 0.015
x=1.1+log $M_{H2O}$.

14. A method as in claim 9 wherein:

at least one pair of said substrates is processed simultaneously, the faces to be coated of each of said pairs of substrates facing each other and being spaced from each other;

wherein said contacting takes place in a suitably shaped and sized reactor;

wherein said substrate is gallium arsenide which is doped with tin, silicon, oxygen or chromium; wherein said contact takes place at a temperature of from about 940° to about 960° C.; and wherein the gallium arsenide p-i-n structure is characterized in having a p region of thickness, $W_p$ (μm), given by, $$W_p = EH^{0.98}(6-5x-9x^2) \text{ for } -1.15 \leq x \leq 0.6$$

$$W_p = 0 \text{ for } x > 0.6 \text{ or } x > -1.15$$

wherein
E=0.011 to 0.015
x=1.1+log $M_{H2O}$.

15. A gallium arsenide p-i-n structure as created by the method of claim 1.

16. A diode comprising a gallium arsenide p-i-n structure as created by the method of claim 1.

17. A thermosensor comprising a gallium arsenide p-i-n structure as created by the method of claim 1.

18. A neutron detector comprising a gallium arsenide p-i-n structure as created by the method of claim 1.

19. A gamma detector comprising a gallium arsenide p-i-n structure as created by the method of claim 1.

20. An opto modulator comprising a gallium arsenide p-i-n structure as created by the method of claim 1.

21. An asymmetrical thyristor comprising a gallium arsenide p-i-n structure as created by the method of claim 1.

22. An opto-thyristor comprising a gallium arsenide p-i-n structure as created by the method of claim 1.

* * * * *

UNITED STATES PATENT AND TRADEMARK OFFICE
CERTIFICATE OF CORRECTION

PATENT NO.: 5,733,815
DATED: March 31, 1998
INVENTOR(S): Ashkinazi et al It is certified that error appears in the above-indentified patent and that said Letters Patent is hereby corrected as shown below:

Column 15, line 40 - change $W_pDH^{0.98}x^3\exp(-1.5x)$ to $W_p=DH^{0.98}x^3\exp(-1.5x)$.

Signed and Sealed this

Seventh Day of July, 1998

*Attest:*

BRUCE LEHMAN

*Attesting Officer*  *Commissioner of Patents and Trademarks*